United States Patent [19]

Soltysik et al.

[11] Patent Number: 4,473,266

[45] Date of Patent: Sep. 25, 1984

[54] LEADLESS CHIP SOCKET

[75] Inventors: George E. Soltysik, Russell; Bruce E. Melquist, Sheffield; Gary H. Robertson, Warren; Robert G. Peterson, Warren; J. Albert Loranger, Jr., Warren, all of Pa.

[73] Assignee: Loranger Manufacturing Corporation, Warren, Pa.

[21] Appl. No.: 342,217

[22] Filed: Jan. 25, 1982

[51] Int. Cl.³ .............................................. H01R 9/09
[52] U.S. Cl. ............................... 339/75 M; 339/17 CF
[58] Field of Search .......... 339/17 CF, 75 M, 75 MP, 339/176 MP

[56] References Cited

U.S. PATENT DOCUMENTS

| | | | |
|---|---|---|---|
| 3,771,109 | 11/1973 | Bruckner et al. | 339/17 CF |
| 4,176,895 | 12/1979 | Aldridge | 339/17 CF |
| 4,188,085 | 2/1980 | Aldridge et al. | 339/17 CF |
| 4,340,266 | 7/1982 | Grovender | 339/17 CF |
| 4,341,433 | 7/1982 | Cherian et al. | 339/176 MP |
| 4,354,720 | 10/1982 | Bakermans | 339/17 CF |

FOREIGN PATENT DOCUMENTS 1092673  12/1980  Canada ............................. 339/17 CF Primary Examiner—John McQuade
Attorney, Agent, or Firm—Charles L. Lovercheck; Wayne L. Lovercheck; Dale R. Lovercheck

[57] ABSTRACT

A chip carrier socket for solid state electronic chip carrier packaged elements made up of a hollow body having a cover, a hinged top on the body providing a space between the top and the body, a chip carrier to be placed in the space and serpentine shaped springs in the hollow body and extending upwardly therethrough to engage electronic metalized pad areas on said chip carrier package. The lower end of the springs being adapted to rest on a bottom closure, the lower ends of the springs extending out through the bottom closure and the upper end of the springs extending through the top of the body and being slidable relative thereto.

5 Claims, 4 Drawing Figures

LEADLESS CHIP SOCKET

GENERAL DESCRIPTION OF THE INVENTION

The chip carrier disclosed herein is designed to accept leadless chip carriers with thickness range from 0.050 inches to 0.100 inches and/or other packages with the differences in package thicknesses of 0.050 inches. The sockets can be used for many applications including ambient testing and high temperature "burn in" testing up to relatively high temperatures i.e. 210° C.

The main advantage of the sockets disclosed herein is that they have a unique spring contact and plastic design which accurately locates the electrical contact point relative to the termination pad on the chip carrier.

The sockets disclosed herein are designed to accept molded pad leadless chip carriers with relatively close center to center pad spacing. The sockets will accept carriers capable of withstanding burn in temperatures up to 210° C.

The sockets which are available in gold plated beryllium copper or gold plated beryllium nickel are designed to generate a normal force of 50 grams when a 0.075 inch thick leadless chip carrier is placed in the socket. The contact is designed such that the normal force generated by a 0.050 inch thick leadless chip carrier is not significantly different than the normal force generated by a 0.100 inch thick leadless chip carrier in the socket. Because of this the force required to close the socket with a 0.050 inch thick leadless carrier in place is not much different than the force required to close the socket with a 0.100 inch leadless chip carrier in place.

The latching mechanism is formed from stainless steel to handle the high temperatures of the environment it is used in. The latch is designed to be easily operated with finger pressure.

When the cover on the socket is closed, the force the contacts exert on the cover through the device keeps the latch in its closed position.

The socket is designed to accept leadless chip carriers on 0.050 inch centers but the design is applicable to other centerlines on subsequent evolutions of the product.

Operation of the socket is very simple. First, the socket is opened by pulling back on the latch part 24 which allows the socket cover 13 to be rotated to the open position to allow the leadless chip carrier 25 to be placed in the socket. The locating bosses 30 on the body 11 provide a large lead-in guide to assist in accurately locating the leadless chip carrier 25 in the socket. With the leadless chip carrier in place as shown in FIG. 2, the socket cover 13 is swung to the closed position. The bosses 31' on the cover contact the top of the leadless chip carrier 25 pushing the carrier down against the contacts. This force causes the contacts to deflect the amount required by the thickness of the leadless chip carrier. When the rotation of the socket cover 13 reaches the fully closed position, the latch 24 snaps into the closed position holding the cover closed and the leadless chip carrier in place.

The entire socket assembly is designed to have a continuous use maximum temperature of 210° C. The plastic parts of the socket are molded from glass reinforced polyphenylene sulfide. The contacts are available in either gold-plated beryllium copper (for use up to 175° C. or gold-plated beryllium nickel (for use up to 210° C.). The latching mechanism is constructed of stainless steel to withstand high temperature exposure. The socket assembly is constructed from several parts. These parts are the latch part 24, the socket cover part 13, the socket body part 11, device locating bosses 30, (located on the socket body part 11) springs 19 having contact ends 27 and 20 and the bottom closure 12.

The contact springs 19 are mechanically and electrically isolated from each other in the socket body and are held captive in the body 11 which is ultrasonically welded to the bottom closure 12. The socket cover 13 is assembled to the socket body 11 by a snap fit. The latch 24 snaps into the socket cover 13 to complete the assembly.

REFERENCE TO PRIOR ART

Applicant knows of no relevant prior art to the above disclosure.

OBJECTS OF THE INVENTION

It is an object of the invention to provide a socket series having the ability to handle a wide range of leadless chip carriers with varying dimensions.

Another object of the invention is to provide a leadless chip carrier with a contact normal force which is uniform over a wide deflection range.

Another object of the invention is to provide a socket that utilizes a self-engaging latching mechanism.

Another object of the invention is to provide an overall size of socket which is much smaller than comparable designs.

Another object of the invention is to provide a unique design of socket which accurately locates the electrical contact point relative to the terminal pad on the chip carrier.

Another object is to provide a socket with a normal force which is fairly constant on a chip carrier over a wide deflection range.

Another object of the invention is to provide a contact that has a large range of deflection.

Another object is to provide a contact which is much smaller than conventional cantilever type contacts.

Another object of the invention is to provide a contact having the above features with a contact surface which is rounded so as not to gall the point of contact on the leadless chip carriers.

Another object of the invention is to provide a one piece, easy to operate latching mechanism.

Another object is to provide a normally closed type of latch.

Another object of the invention is to provide a latch that when placed under load, may be opened easily with finger pressure.

With the above and other objects in view, the present invention consists of the combination and arrangement of parts hereinafter more fully described, illustrated in the accompanying drawing and more particularly pointed out in the appended claims, it being understood that changes may be made in the form, size, proportions and minor details of construction without departing from the spirit or sacrificing any of the advantages of the invention.

GENERAL DESCRIPTION OF THE DRAWINGS

DETAILED DESCRIPTION OF THE DRAWINGS

Figure 1:
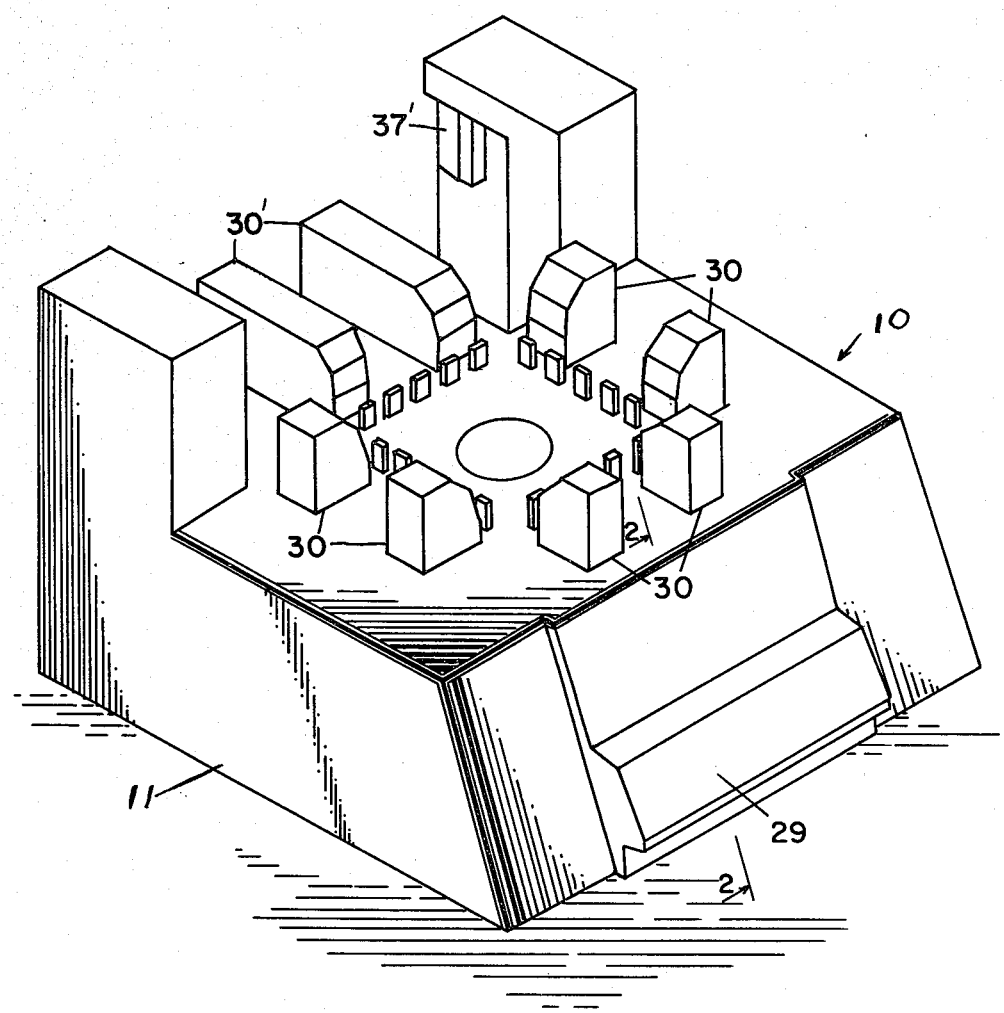
FIG. 1 is a isometric view of the chip carrier body according to the invention without the socket cover and a chip carrier in place.
Figures 2, 4:
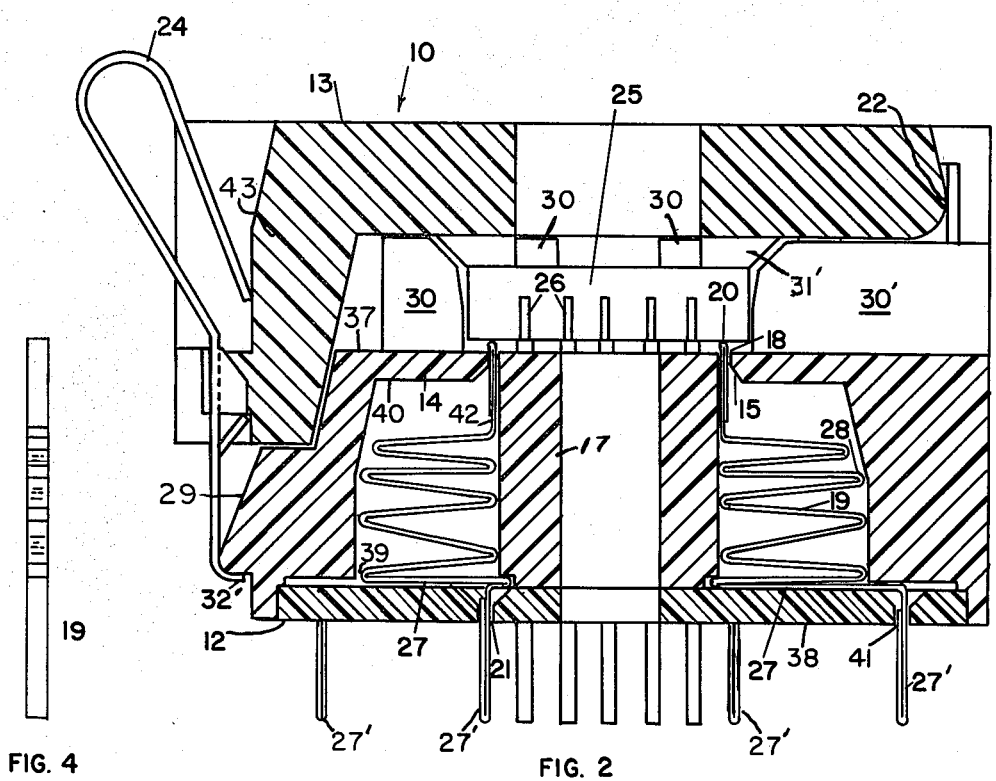
FIG. 2 is a longitudinal cross sectional view taken on line 2—2 of the body of FIG. 1 showing a cover and chip carrier in place.
FIG. 4 is an integrated side view of the spring contact.
Figure 3:
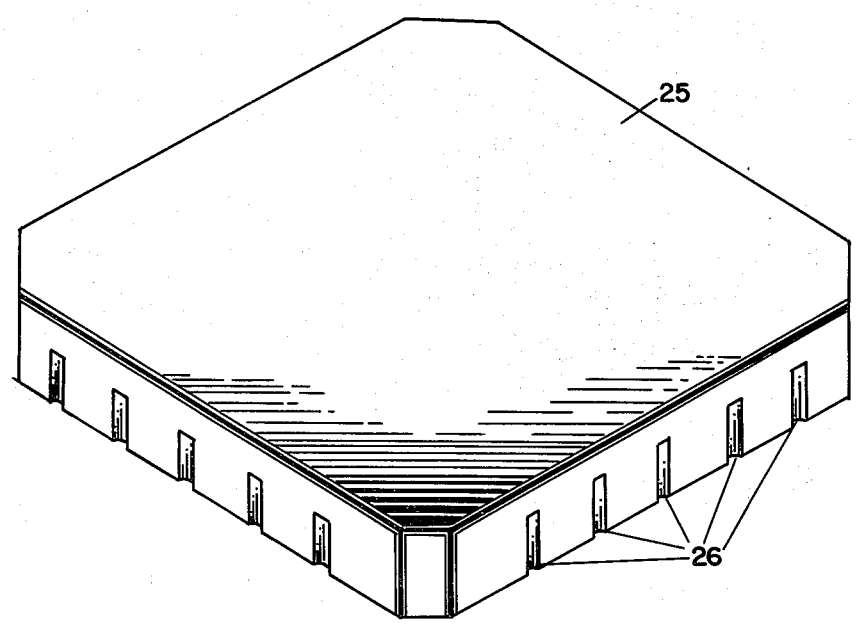
FIG. 3 is an isometric view of the chip carrier, the chip carrier is a package style used by Semiconductor Manufacturers to house their integrated circuit designs. The invention is meant to provide an electrical connection to the chip carrier.

Now with more particular reference to the drawings. A chip carrier socket is shown comprising a hollow body 11, the bottom having a bottom closure 12 and a top closure 14 defining a hollow space therebetween, a cover 13 is swingably attached to the body at pivot 22 and bosses 37' and swingable from an open position to the closed position shown defining a space between the top closure 14 and the cover 13. A chip carrier 25 which is normally square in shape (but not restricted to that shape) and has a plurality of metalized pads to which contact arms 26 are connected, is supported on the upper end of the contacts 20 with one contact engaging each metalized pad. The body has a substantially flat outside top surface 37 and a substantially flat outside bottom surface 38. A substantially flat inside bottom surface 39, with flat sides. The body 11 has a hollow 42 inside defined by the relatively flat inside bottom surface 39 and a relatively flat inside top surface 40. The bottom 12 has spaced openings 21 and 41 and openings 18 extend through the top 14 from hollow 42 to the outside. A plurality of springs 19, each made of a continuous piece of material of generally uniform cross section, having accordion pleated sections 28 between the upper ends 20 and the lower ends 27'. Upper straight ends 20 extend through openings 18 in the top 14 and the lower straight ends 27' extend through openings 41 and 21 in the bottom 12. Each spring 19 has a lower end convolution that rests on bottom 12. The upper contact members 20 extend through the holes 18 and terminate a substantial distance above the top surface 37. The cover 13 has a flat bottom surface which rests on the bosses 30 and the flange 43 which is attached to the cover 13 rests on the boss 29. The spring latch 24 which is supported on the flange 43 in a manner familiar to those skilled in the art has an end 32' which underlies the boss 29 on the body when the cover is in the closed position as shown in FIG. 2. Springs having an intermediate accordion pleated part made of four convolutions generally accordion pleated in shape. Pleats have generally straight intermediate parts and straight upper contact ends 20 that extend through the holes 18, which have tapered recesses 15, in the top 14. Lower ends 27' of the springs extend through holes 21 in bottom 12 and may connect to a suitable conductor. Springs 19 are supported in the space between the boss 17 and the inside of the inside of the hollow body. The boss 17 is part of the top 14. The upper end of the contacts 20 project through and are slideably received in holes 18. Each of the contact springs 19 are formed of an electronically conductive material such as beryllium copper which may be gold plated. The upper end of the contacts 20 extend through holes in top 14 and slide up and down when the springs 19 are compressed by the chip carrier 25 when the cover 13 is closed.

The latch means 24 is adapted to hold the cover in closed position. The latch may be attached to cover 13 in a suitable manner familiar to those skilled in the art. When the cover engages the socket body as said cover swings to the closed position deflecting the convoluted springs which exert an even force on the contact. The end 32' underlies the boss 29 holding the cover 13 in position. The convolutions of the springs are generally sinusoidal in shape and formed into accordian shaped pleats, that is, the ends of the convolutions are curved and the parts between the ends are straight so that when compressed by a force on the upper ends 20 of the contacts and on the lower convolutions 27 will cause the intermediate parts of the spring 19 to act in a cantilever fashion. It will be noted that the amplitude of the convolutions on the upper end of the spring are less than the amplitude of the lower convolutions resulting in a more uniform spring action. Likewise, the inner crests of the springs rest against the boss 17 and the lower convolutions 27 rest on the bottom cover 12 while the lower contact ends 27' are bent at right angles to the lower convolution and through spaced openings 21 in the bottom cover 12.

The body 11 has spaced upwardly extending bosses 30 and 30' that engage the underside of the cover 13 when in close position thereby limiting the downward swinging movement of the cover and the cover has downwardly extending bosses 31' thereon which engage the upper side of the chip carrier 25 thereby holding it down against the tension of the springs 19.

The ends of the contacts 27' and the ends of the contacts 20 are bent back on themselves providing a smooth surface to prevent galling. The socket cover 13 is rotated to the open position to allow the leadless chip carrier 25 to be placed in the socket. The locating bosses 30' on the body 11 have large lead in area to assist in accurately locating the chip carrier 25 in the socket. With the leadless chip carrier 25 in place the socket cover 13 is swung to close position. The bosses 31' on the cover 13 contact the top of the leadless chip carrier 25 pushing the carrier down against the contacts ends 20. Boss 17 has a recess on its lower end which receives an end of the lowermost convolution 27 of each spring contact. This force causes the contacts 19 to deflect the amount required by the thickness of the leadless chip carrier. When the cover reaches it fully closed position, the latch 24 snaps into the closed position holding the cover closed and the leadless chip carrier in place.

The foregoing specification sets forth the invention in its preferred, practical forms but the structure shown is capable of modification within a range of equivalents without departing from the invention which is to be understood is broadly novel as is commensurate with the appended claims.

The embodiments of the invention in which an exclusive property or privilege is claimed are defined as follows:

1. A leadless chip socket comprising,
   a body having a hollow therein,
   said body having a top having a substantially flat outside top surface, a bottom having a substantially flat bottom surface and sides,
   said hollow in said body being defined by a relatively flat inside bottom surface and a relatively flat inside top surface,
   spaced first openings extending through said top from said hollow to the outside of said body, spaced second openings in said bottom and extending from said hollow to the outside of said body, a plurality of accordion pleated springs in said hollow, each said spring being made up of a continuous piece of material of generally uniform cross section, each said piece of material having an intermediate accordion pleated portion and a straight upper end contact member and a straight lower end contact member, each said upper contact member extending upwardly through a said first opening a substantial distance, said lower contact members extending through said second openings in said bottom a substantial distance, a cover having a generally flat bottom surface, means supporting said cover on said body with a space therebetween for receiving a plate-like chip carrier with said upper contact members engaging the lower side of said chip carrier, thereby deflecting said accordion pleated portion of said springs whereby generally uniform force is exerted on said chip carrier, said cover being adapted to swing to an open position with said cover generally perpendicular to said outside top surface whereby a chip carrier can be removed from said space, latch means on said cover for holding said cover in closed position with a chip carrier in said space.

2. The socket recited in claim 1 wherein said springs are made of relatively thin flat material.

3. The socket recited in claim 1 wherein said body has spaced upwardly extending bosses thereon for engaging said chip carrier and accurately locating said chip carrier relative to said socket.

4. The leadless chip socket recited in claim 1 wherein some of said springs each have an end convolution resting on said bottom.

5. The leadless chip socket recited in claim 4 wherein said upper end contact members are moveable a substantial distance towards said top of said body.

* * * * *